(12) United States Patent
Hsieh et al.

(10) Patent No.: US 10,763,168 B2
(45) Date of Patent: Sep. 1, 2020

(54) SEMICONDUCTOR STRUCTURE WITH DOPED VIA PLUG AND METHOD FOR FORMING THE SAME

(71) Applicant: Taiwan Semiconductor Manufacturing Co., Ltd., Hsinchu (TW)

(72) Inventors: Tung-Po Hsieh, Hsinchu (TW); Su-Hao Liu, Jhongpu Township, Chiayi County (TW); Hong-Chih Liu, Zhubei (TW); Jing-Huei Huang, Yuanshan Township, Yilan County (TW); Jie-Huang Huang, Taoyuan (TW); Lun-Kuang Tan, Hsinchu (TW); Huicheng Chang, Tainan (TW); Liang-Yin Chen, Hsinchu (TW); Kuo-Ju Chen, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/021,216

(22) Filed: Jun. 28, 2018

(65) Prior Publication Data
US 2019/0157148 A1 May 23, 2019

Related U.S. Application Data

(60) Provisional application No. 62/587,628, filed on Nov. 17, 2017.

(51) Int. Cl.
*H01L 21/768* (2006.01)
*H01L 29/66* (2006.01)
(Continued)

(52) U.S. Cl.
CPC .. *H01L 21/76897* (2013.01); *H01L 21/76816* (2013.01); *H01L 21/823431* (2013.01);
(Continued)

(58) Field of Classification Search
CPC ......... H01L 21/76897; H01L 21/76816; H01L 21/823475; H01L 21/76883;
(Continued)

(56) References Cited

U.S. PATENT DOCUMENTS 6,022,808 A * 2/2000 Nogami ............ H01L 21/76877
  216/17
6,046,108 A * 4/2000 Liu ...................... H01L 21/7684
  257/E21.583
(Continued)

*Primary Examiner* — David A Zarneke
(74) *Attorney, Agent, or Firm* — Birch, Stewart, Kolasch & Birch, LLP

(57) ABSTRACT

A semiconductor structure and a method for forming the same are provided. The semiconductor structure includes a gate structure, a source/drain structure, a first contact plug and a first via plug. The gate structure is positioned over a fin structure. The source/drain structure is positioned in the fin structure and adjacent to the gate structure. The first contact plug is positioned over the source/drain structure. The first via plug is positioned over the first contact plug. The first via plug includes a first group IV element.

20 Claims, 10 Drawing Sheets

(51) Int. Cl.
*H01L 29/78* (2006.01)
*H01L 23/532* (2006.01)
*H01L 21/8234* (2006.01)
*H01L 23/522* (2006.01)
*H01L 27/088* (2006.01)
*H01L 27/092* (2006.01)
*H01L 21/8238* (2006.01)
*H01L 29/417* (2006.01)

(52) U.S. Cl.
CPC .. *H01L 21/823821* (2013.01); *H01L 23/5226* (2013.01); *H01L 23/53261* (2013.01); *H01L 27/0886* (2013.01); *H01L 27/0924* (2013.01); *H01L 29/41791* (2013.01); *H01L 29/66795* (2013.01); *H01L 29/785* (2013.01); *H01L 29/66545* (2013.01); *H01L 29/7848* (2013.01)

(58) Field of Classification Search
CPC ... H01L 23/5226; H01L 23/532–53266; H01L 21/76859; H01L 21/76825; H01L 21/265
See application file for complete search history.

(56) References Cited

U.S. PATENT DOCUMENTS

| | | | | |
|---|---|---|---|---|
| 6,096,648 A * | 8/2000 | Lopatin | H01L 21/76819 | 257/E21.576 |
| 6,117,770 A * | 9/2000 | Pramanick | H01L 21/76843 | 257/E21.584 |
| 6,130,162 A * | 10/2000 | Liu | H01L 21/76841 | 257/E21.584 |
| 6,268,291 B1 * | 7/2001 | Andricacos | H01L 21/76883 | 257/E21.175 |
| 6,433,994 B2 * | 8/2002 | Tang | H01L 21/76897 | 257/E21.507 |
| 6,500,749 B1 * | 12/2002 | Liu | H01L 21/76834 | 257/E21.576 |
| 6,633,085 B1 * | 10/2003 | Besser | H01L 21/76802 | 257/643 |
| 6,703,307 B2 * | 3/2004 | Lopatin | H01L 21/76846 | 438/553 |
| 6,703,309 B1 * | 3/2004 | Chopra | H01L 21/76825 | 257/E21.576 |
| 6,821,890 B2 * | 11/2004 | McGahay | H01L 21/76834 | 257/E21.586 |
| 7,309,651 B2 * | 12/2007 | West | H01L 21/76886 | 257/E21.591 |
| 7,655,556 B2 * | 2/2010 | Chang | H01L 21/28556 | 257/E21.579 |
| 7,989,338 B2 * | 8/2011 | Zhang | H01L 21/76856 | 438/622 |
| 8,329,577 B2 * | 12/2012 | Lehr | H01L 21/76849 | 438/659 |
| 8,334,206 B2 * | 12/2012 | Carreau | H01L 21/76877 | 257/E23.15 |
| 8,358,007 B2 * | 1/2013 | Sohn | H01L 21/3105 | 257/741 |
| 9,082,824 B2 * | 7/2015 | Reber | H01L 21/76877 | |
| 9,412,660 B1 * | 8/2016 | Xie | H01L 21/76897 | |
| 9,711,452 B2 * | 7/2017 | Clevenger | H01L 23/53238 | |
| 9,899,327 B2 * | 2/2018 | Yang | H01L 23/53238 | |
| 9,947,621 B2 * | 4/2018 | Adusumilli | H01L 21/76858 | |
| 10,103,098 B2 * | 10/2018 | Jung | H01L 21/76886 | |
| 10,128,148 B2 * | 11/2018 | Nguyen | H01L 21/76814 | |
| 10,157,786 B2 * | 12/2018 | Haukka | H01L 21/02068 | |
| 2013/0140698 A1 * | 6/2013 | Lakshmanan | H01L 21/76843 | 257/751 |
| 2013/0277746 A1 * | 10/2013 | Baldauf | H01L 21/823807 | 257/368 |
| 2014/0120709 A1 * | 5/2014 | Cheng | H01L 21/76897 | 438/585 |
| 2014/0183688 A1 * | 7/2014 | Bao | H01L 23/5226 | 257/529 |
| 2015/0249038 A1 * | 9/2015 | Xu | H01L 23/53223 | 257/751 |
| 2015/0270176 A1 * | 9/2015 | Xie | H01L 21/76885 | 257/384 |
| 2016/0163651 A1 * | 6/2016 | Clevenger | H01L 23/53238 | 257/767 |
| 2018/0145034 A1 * | 5/2018 | Xu | H01L 21/02068 | |

* cited by examiner

SEMICONDUCTOR STRUCTURE WITH DOPED VIA PLUG AND METHOD FOR FORMING THE SAME

CROSS REFERENCE TO RELATED APPLICATIONS

This Application claims the benefit of U.S. Provisional Application No. 62/587,628, filed on Nov. 17, 2017, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Despite groundbreaking advances in materials and fabrication, scaling planar devices such as the metal-oxide-semiconductor field effect transistor (MOSFET) device has proven challenging. To overcome these challenges, circuit designers look to novel structures to deliver improved performance, which has resulted in the development of three-dimensional designs, such as fin-like field effect transistors (FinFETs). The FinFET is fabricated with a thin vertical "fin" (or fin structure) extending up from a substrate. The channel of the FinFET is formed in this vertical fin. A gate is provided over the fin to allow the gate to control the channel from multiple sides. The advantages of the FinFET may include a reduction of the short channel effect, reduced leakage, and a higher current flow.

However, since feature sizes continue to decrease, fabrication processes continue to become more difficult to perform. Therefore, it is a challenge to form a reliable semiconductor structure including the FinFET.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
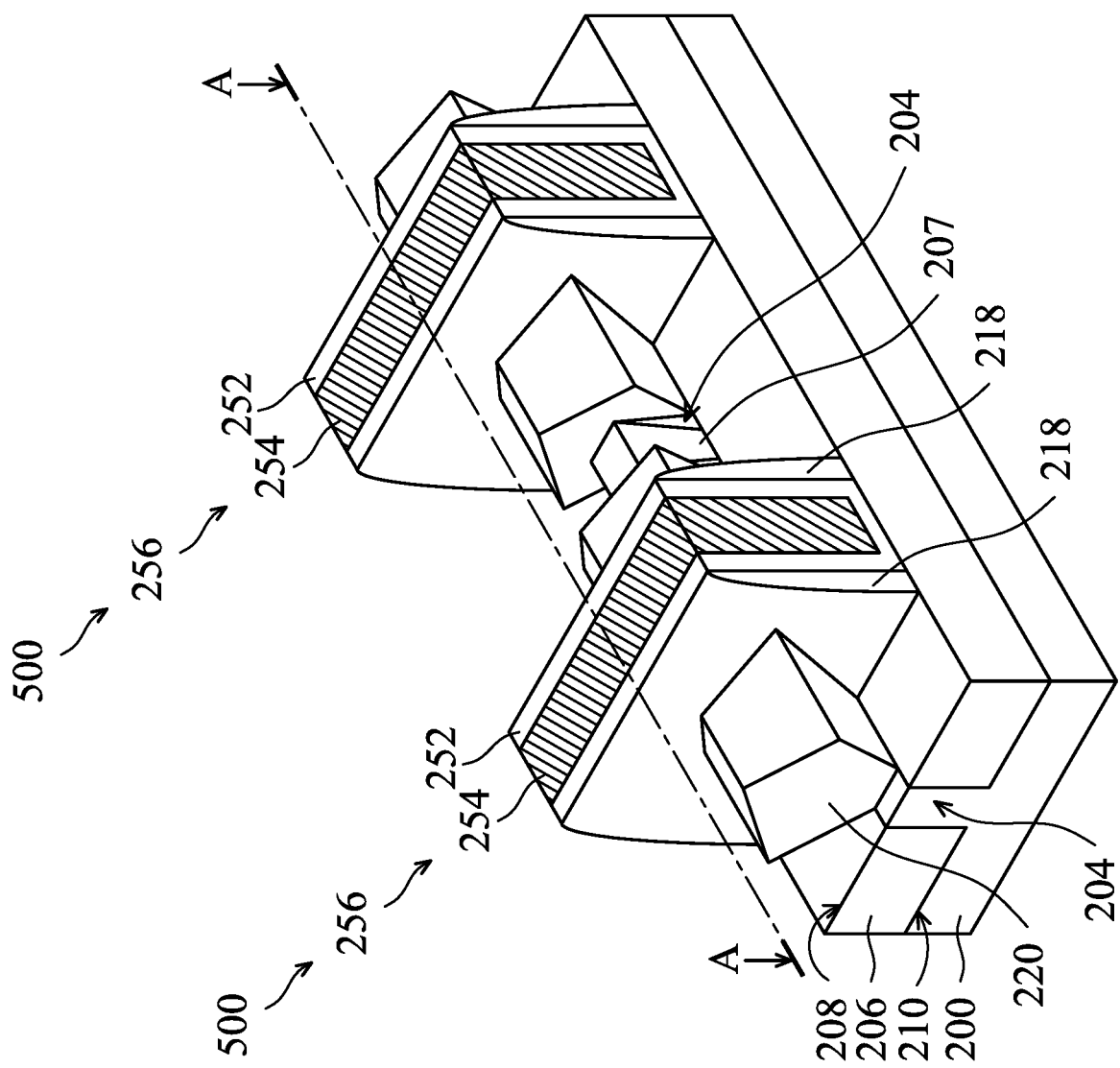
FIG. 1 is a three-dimensional view of an example simplified fin field effect transistor (FinFET) in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 illustrates a three-dimensional (3D) view of an example of simplified fin field effect transistors (FinFETs) 500 in accordance with some embodiments. Other aspects not illustrated in or described with respect to FIG. 1 may become apparent from the following figures and description. Each of the FinFETs 500 includes a portion of a fin structure 204 on a substrate 200. The fin structure 204 of the substrate 200 protrudes above a top surface 208 of isolation regions 206 (e.g., shallow trench isolation structures) on the substrate 200. In addition, the fin structure 204 may be formed between the neighboring isolation regions 206. Each of the FinFETs 500 includes a gate structure 256 positioned over the fin structure 204. The gate structure 256 may include a gate dielectric layer 252 and a gate electrode layer 254. The gate dielectric layer 252 may be positioned along sidewalls and over the top surface of the fin structure 204, and the gate electrode layer 254 may be positioned over the gate dielectric layer 252. Gate spacers 218 may be positioned along sidewalls of the gate dielectric layer 252. Each of the FinFETs 500 includes source/drain structures 220 disposed in opposing regions of the fin structure 204 with respect to the gate dielectric layer 252 and the gate electrode layer 254. FIG. 1 further illustrates a reference cross-section along line A-A' that is used for later figures. The cross-section along line A-A' may be in a plane along, e.g., a channel in the fin structure 204 between the opposing source/drain structures 220.

The source/drain structures 220 may be shared between various transistors, for example. In some examples, the source/drain structures 220 may be connected or coupled to other FinFETs such that the FinFETs are implemented as one functional transistor. For example, if neighboring (e.g., as opposed to opposing) source/drain regions are electrically connected, such as through coalescing the regions by epitaxial growth, one functional transistor may be implemented. Other configurations in other examples may implement other numbers of functional transistors.

Embodiments of a semiconductor structure and a method for forming the same are provided. FIGS. 2A-2I are cross-sectional views along line A-A' of FIG. 1 of various stages of a process for forming a semiconductor structure 600, in accordance with some embodiments. It should be noted that the cross-sectional views of the semiconductor structure are taken along the longitudinal direction (the channel length direction of a FinFET) of a fin structure (e.g. the fin structure 204) of the semiconductor structure.

In some embodiments, a gate-replacement (gate-last) process is employed to fabricate the semiconductor structures 600 including, for example, a fin field effect transistor (FinFET) (e.g. FinFETs 500A and 500B) or an input/output (IO) device (e.g. an input/output (IO) device 500C).

Figure 2A:
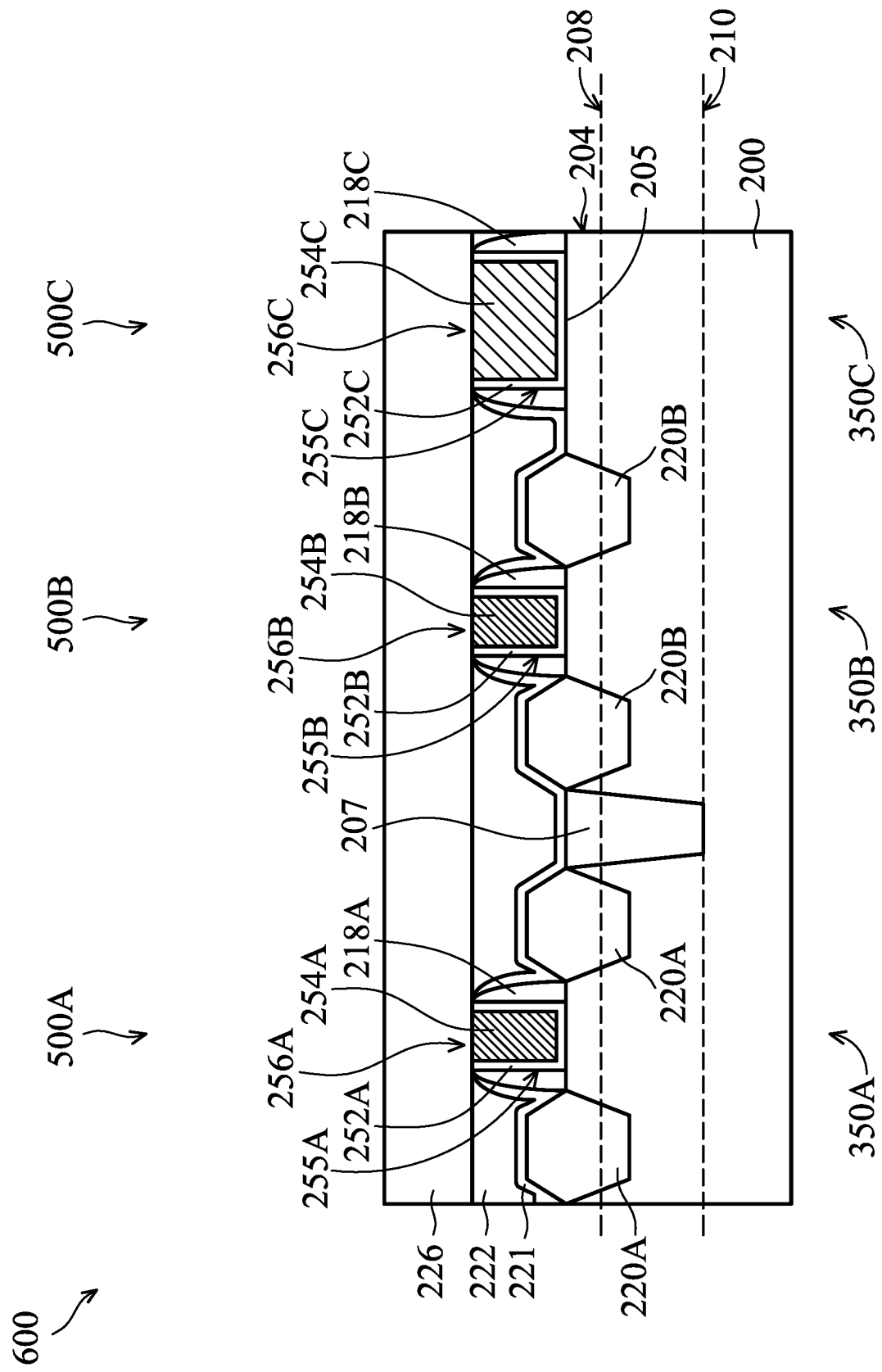
FIGS. 2A-2I are cross-sectional views along line A-A' of FIG. 1 showing various stages of a process for forming a semiconductor structure, in accordance with some embodiments.

As shown in FIG. 2A, a substrate 200 including a fin structure 204 is received. In some embodiments, the substrate 200 may be a semiconductor substrate, such as a bulk semiconductor, a semiconductor-on-insulator (SOI) substrate, or the like, which may be doped (e.g. with a P-type or an N-type dopant) or undoped. The substrate 200 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 200 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the substrate 200 has a first region 350A, a second region 350B and a third region 350C. The second region 350B may be adjacent to the first region 350A, and the third region 350C may be adjacent to second region 350B. The first region 350A may be for forming N-type devices, such as N-type metal-oxide-semiconductor field-effect transistors (MOSFETs) (e.g. the FinFET 500A). The second region 350B may be for forming P-type devices, such as P-type metal-oxide-semiconductor field-effect transistors (MOSFETs) (e.g. the FinFET 500B). The third region 350C may be for forming input/output (IO) devices (e.g. the IO device 500C). Therefore, the first region 350A may be referred to as an NMOS region, the second region 350B may be referred to as a PMOS region, and the third region 350C may be referred to as an IO device region.

In some embodiments, the fin structure 204 is formed by performing a patterning process on the substrate 200. The fin structure 204 may comprise a first isolation region 207 (e.g. a shallow trench isolation (STI) structure) filled in a first trench embedded in the fin structure 204. In addition, the fin structure 204 may be surrounded by second trenches (not shown) formed in the substrate 200 by the patterning process. Second isolation regions (not shown) (e.g. shallow trench isolation (STI) structures) may be formed on a bottom surface 210 of each of the trenches. A lower portion of the fin structure 204 is surrounded by the second isolation regions, and an upper portion of the fin structure 204 protrudes from a top surface 208 of each of the second isolation regions.

After the isolation regions are formed, dummy gate structures (not shown) are formed over a top surface 205 of the fin structure 204. In addition, hard mask layers are formed on the dummy gate structures. In some embodiments, the dummy gate structures cover respective channel regions of the resulting finFETs (e.g. the FinFETs 500A and 500B) on the fin structure 204. In addition, the dummy gate structures may be separated from each other by the first isolation region 207. In some embodiments, the dummy gate structures cover the top surface 205 and sidewalls of the fin structure 204, and extend over the isolation regions and the substrate 200 outside the fin structure 204. In some embodiments, each of the dummy gate structures includes a gate dielectric (not shown) and a gate electrode (not shown) formed over the gate dielectric.

Afterwards, gate spacers 218A, 218B and 218C are formed on opposite sidewalls of the dummy gate structure and over the fin structure 204, as shown in FIG. 2A in accordance with some embodiments. The gate spacers 218A, 218B and 218C may include a single layer structure or a multi-layer structure. The gate spacer spacers 218A, 218B and 218C may be made of low dielectric constant (low-k) materials (e.g. k<5), such as silicon oxide, silicon nitride, silicon oxynitride, silicon carbide, silicon carbonitride, another suitable material, or a combination thereof. In some embodiments, the gate spacers 218A, 218B and 218C are formed by a deposition process and a subsequent etching process. The deposition process may include a chemical vapor deposition (CVD) process, a physical vapor deposition (PVD) process, a spin-on process, another applicable process, or a combination thereof. The etching process may include a dry etch process.

After the gate spacers 218A, 218B and 218C are formed, source/drain structures 220A and 220B are formed in portions of the fin structure 204 that is not covered by the dummy gate structures and the gate spacers 218A, 218B and 218C, as shown in FIG. 2A in accordance with some embodiments. The source/drain structures 220A and 220B may be formed in the fin structure 204 and adjacent to the gate spacers 218A and the gate spacers 218B. In addition, the source/drain structures 220A are separated from the source/drain structures 220B by the first isolation region 207.

In some embodiments, the source/drain structures 220A and 220B may include a strain material to apply stress to the channel region. For example, the source/drain structures 220A and 220B are formed of Ge, SiGe, InAs, InGaAs, InSb, GaAs, GaSb, InAlP, InP, or the like. In some embodiments, the lattice constant of the source/drain structures 220A and 220B are different from the lattice constant of the fin structure 204. In some embodiments, the source/drain structures 220A and 220B have a hexagonal shape as shown in FIG. 2A, but the present disclosure is not limited thereto. In some other embodiments, the source/drain structures 220A and 220B may be diamond-shaped, any other applicable shape, or a combination thereof. In addition, bottoms of the source/drain structures 220A and 220B may be positioned below the top surface 208 of each of the isolation structures surrounding the fin structure 204.

The source/drain structures 220A and 220B may be formed by an etching process and a subsequent filling process. The etching process is performed to form recesses (not shown) adjacent to the gate spacers 218A and 218B and in the fin structure 204. In some embodiments, the etching process is a dry etching process. In some embodiments, the filling process (not shown) is performed by filling the recesses with one or more strained semiconductor materials to form the source/drain structures 220A and 220B. In some embodiments, the filling process includes an epitaxial process, such as a selective epitaxial growth (SEG) process, CVD deposition techniques (e.g. vapor-phase epitaxy (VPE) and/or ultra-high vacuum CVD (UHV-CVD)), molecular beam epitaxy, or another suitable epitaxial process.

After the source/drain structures 220A and 220B are formed, a contact etch stop layer (CESL) 221 is conformally deposited over the source/drain structures 220A and 220B and the gate spacers 218A, 218B and 218C by a thin film deposition process, as shown in FIG. 2A in accordance with some embodiments. The CESL 221 may serve as an etch stop layer of the subsequent etching process configured to form source/drain contact holes (not shown). In some embodiments, the CESL 221 may be a single layer or multiple layers. The CESL 221 may be made of silicon carbide (SiC), silicon nitride ($Si_xN_y$), silicon carbonitride (SiCN), silicon oxycarbide (SiOC), silicon oxycarbon nitride (SiOCN), silicon oxide ($SiO_2$) or another applicable material. In some embodiments, the CESL 221 has a bi-layer structure which includes a $SiO_2$ layer formed on a SiC layer. In addition, a SiC layer may be used as a glue layer to improve adhesion between the underlying layer and the $SiO_2$ layer. In some embodiments, the CESL 221 is formed by performing a plasma enhanced chemical vapor deposition (CVD) process, a low pressure CVD process, an atomic layer deposition (ALD) process, or another applicable process.

After the CESL 221 is formed, a dielectric layer 222 (such as a first inter-layer dielectric (ILD) layer) is formed over the fin structure 204, the dummy gate structures, the gate spacers 218A, 218B and 218C, and the source/drain structures 220A and 220B, as shown in FIG. 2A in accordance with some embodiments. The dielectric layer 222 may be formed over the CESL 221 and may fill gaps between the dummy gate structures. In some embodiments, the dummy gate structures are surrounded by the dielectric layer 222.

In some embodiments, a deposition process is performed to form the dielectric layer 222 over the CESL 221. Afterwards, a planarization process is performed to level the top surfaces of CESL 221, the dielectric layer 222, the gate spacers 218A and 218B, and the dummy gate structures.

In some embodiments, the dielectric layer 222 is made of a dielectric material such as silicon oxide, phosphosilicate glass (PSG), borosilicate glass (BSG), boron-doped phosphosilicate Glass (BPSG), undoped silicate glass (USG), carbon-doped silicate glass, silicon nitride or silicon oxynitride. In some embodiments, the dielectric layer 222 is made of an extreme low-k (ELK) dielectric material with a dielectric constant (k) less than about 2.5. With geometric size shrinking as technology nodes advance to 30 nm and beyond, ELK dielectric material is used to minimize device RC (time constant, R: resistance, C: capacitance) delay. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon dioxide ($SiO_2$). In some embodiments, ELK dielectric material is deposited by a plasma enhanced chemical vapor deposition (PECVD) process or by a spin coating process.

In some embodiments, the deposition process of the dielectric layer 222 includes a plasma enhanced chemical vapor deposition (CVD) process, a low pressure CVD process, an atomic layer deposition (ALD) process, flowable CVD (FCVD process), a spin-on coating process, or another applicable process. In some embodiments, the planarization process includes a chemical mechanical polishing (CMP) process, a grinding process, an etching process, another applicable process, or a combination thereof.

After the dielectric layer 222 is formed, gate structures 256A, 256B and 256C are formed to replace the dummy gate structure by a removal process, a deposition processes and a subsequent planarization process, as shown in FIG. 2A in accordance with some embodiments. In some embodiments, the gate structure 256A surrounded by the gate spacers 218A includes a gate dielectric layer 252A and a gate electrode layer 254A over the gate dielectric layer 252A. Similarly, the gate structure 256B surrounded by the gate spacers 218B may include a gate dielectric layer 252B and a gate electrode layer 254B over the gate dielectric layer 252B. The gate structure 256C surrounded by the gate spacers 218C may include a gate dielectric layer 252C and a gate electrode layer 254C over the gate dielectric layer 252C. In some embodiments, the gate spacers 218A are positioned on opposite sidewall surfaces 255A of the gate structure 256A. The gate spacers 218B may be positioned on opposite sidewall surfaces 255B of the gate structure 256B. The gate spacers 218C may be positioned on opposite sidewall surfaces 255C of the gate structure 256C.

In some embodiments, the gate dielectric layers 252A, 252B and 252C include a single layer or multiple layers. In some embodiments, the gate dielectric layers 252A, 252B and 252C have a U-shape or a rectangular shape. In some embodiments, the gate dielectric layers 252A, 252B and 252C are formed of silicon oxide, silicon nitride, or a high-k dielectric material (k>7.0) including a metal oxide or a silicate of Hf, Al, Zr, La, Mg, Ba, Ti, Pb, or a combination thereof. The formation methods of gate dielectric layers 252A, 252B and 252C may include molecular beam deposition (MBD), atomic layer deposition (ALD), plasma enhanced CVD (PECVD), and the like.

In some embodiments, the gate electrode layers 254A, 254B and 254C are made of a metal-containing material such as TiN, TaN, TaC, Co, Ru, Al, combinations thereof, or multi-layers thereof, and are formed by a deposition process, such as electroplating, electroless plating, or another suitable method.

In some embodiments, a work function layer (not shown) may be formed in the gate structures 256A, 256B and 256C. The work function layer may include an N-type work-function layer or a P-type work-function layer. The P-type work function layer may include TiN, TaN, Ru, Mo, Al, WN, $ZrSi_2$, $MoSi_2$, $TaSi_2$, $NiSi_2$, WN, another suitable P-type work function material, or a combination thereof. The N-type work function layer may include Ti, Ag, TaAl, TaAlC, TiAlN, TaC, TaCN, TaSiN, Mn, Zr, another suitable N-type work function material, or a combination thereof. In some embodiments, the work function layer in the gate structures 256A may include the N-type work-function layer, and the gate structure 256B may include the P-type work-function layer.

Afterward, a dielectric layer (e.g. a second inter-layer dielectric (ILD) layer)) 226 is formed over the dielectric layer 222 and the gate structures 256A, 256B and 256C, as shown in FIG. 2A in accordance with some embodiments. For example, the dielectric layer 226 may be a flowable film formed by a flowable CVD method. In some embodiments, the dielectric layer 226 is formed of a dielectric material such as PSG, BSG, BPSG, USG, or the like, and may be deposited by any suitable method, such as CVD and PECVD.

Figure 2B:
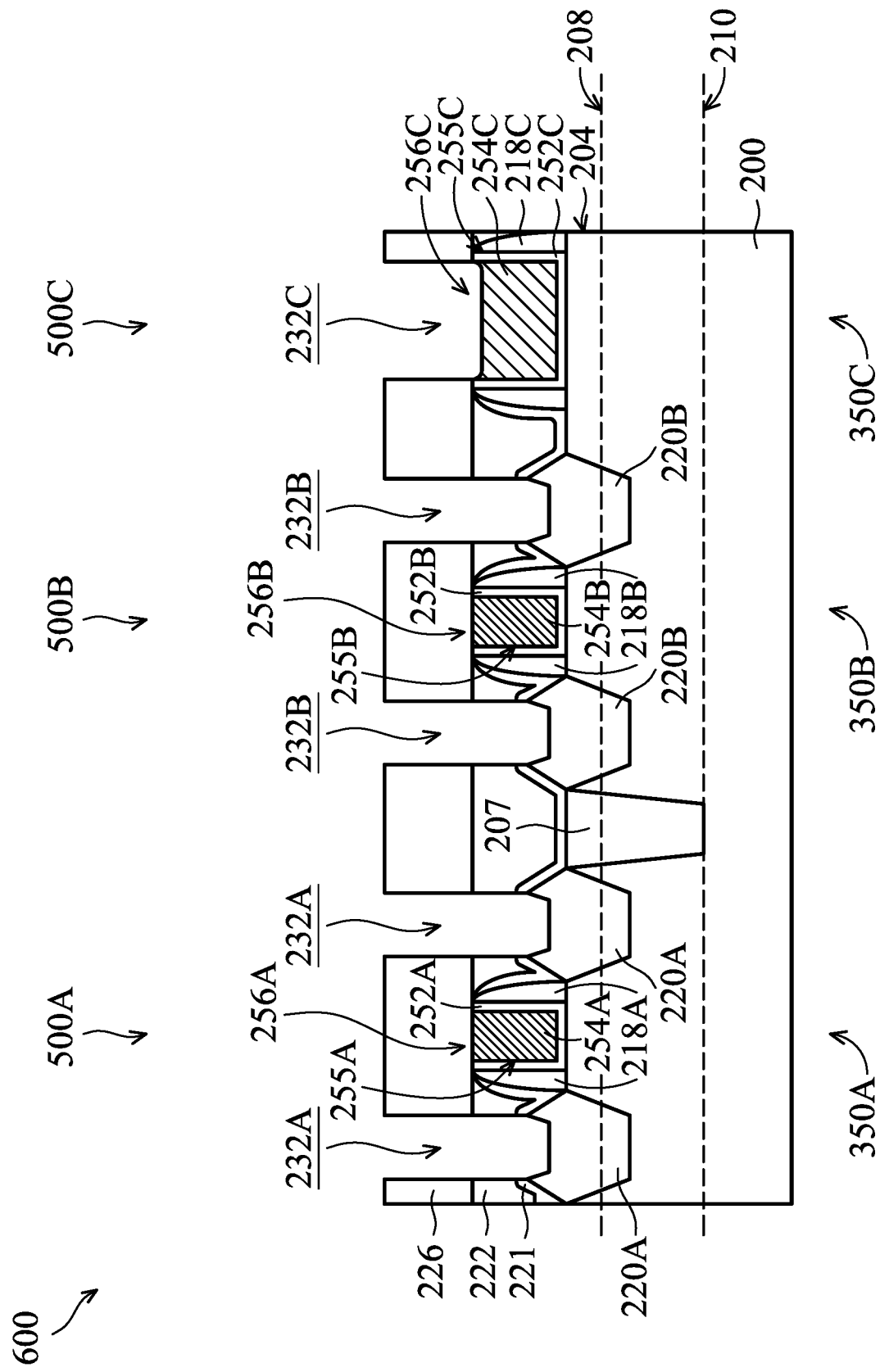

After the dielectric layer 226 is formed, openings 232A, 232B and 232C in the dielectric layers 222 and 226 by a patterning process, as shown in FIG. 2B in accordance with some embodiments. In some embodiments, the patterning process may be performed to remove portions of the dielectric layers 222 and 226 and the CESL 221 to form the openings 232A, 232B and 232C and to stop on the source/drain structures 220A and 220B and the gate structure 256C. Therefore, the openings 232A, 232B and 232C are formed passing through the dielectric layers 222 and 226 and the CESL 221 to expose the source/drain structures 220A and 220B and the gate structure 256C. In some embodiments, the patterning process also removes portions of the source/drain structures 220A and 220B. Therefore, the lower portions of the openings 232A, 232B and 232C are embedded in the source/drain structures 220A and 220B.

In some embodiments, the patterning process of the openings 232A, 232B and 232C include a photolithography processes and a subsequent etching process. The photolithography process may include photoresist coating (e.g. spin-on coating), soft baking, mask aligning, exposure, post-exposure baking, developing the photoresist, rinsing and drying (e.g. hard baking). In some embodiments, the etching process is a dry etching process. In addition, etching gases used in the etching process include fluorine-containing (F-containing) gases. In some embodiments, a mask layer (not shown) may be used in the patterning process. After the openings 232A, 232B and 232C are formed, the mask layer may be removed by etching or any other suitable method.

Figure 2C:
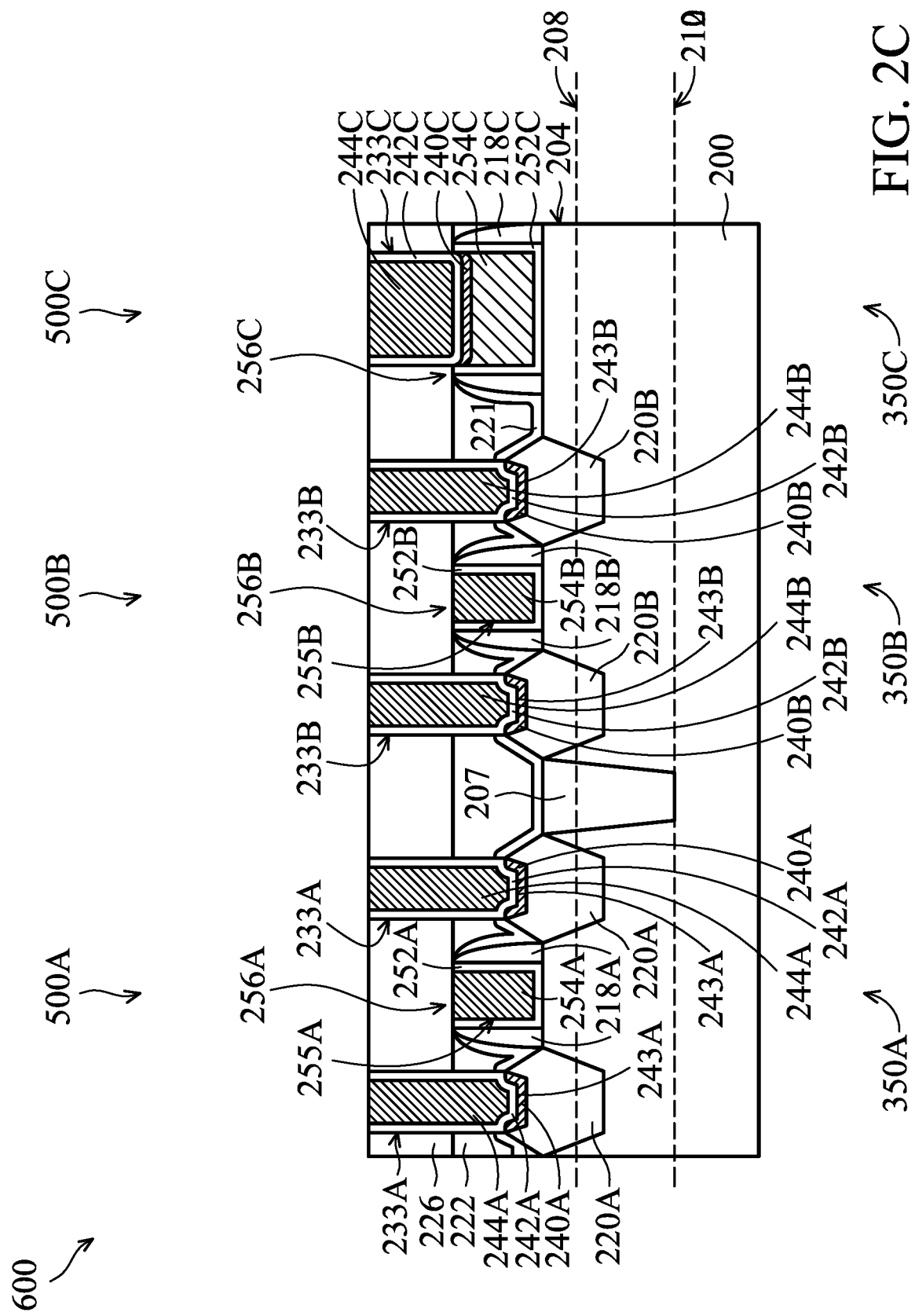

Afterward, source/drain silicide layers 240A, 240B and 240C are formed on the source/drain structures 220A and 220B and the gate structure 256C by a silicidation process, as shown in FIG. 2C in accordance with some embodiments. In some embodiments, the silicidation process includes a metal material deposition process and an annealing process performed in sequence. In some embodiments, the deposition process of the silicidation process includes a physical vapor deposition (PVD) process, an atomic layer deposition (ALD) process, or another applicable process. In some embodiments, the annealing process of the silicidation process is performed at a temperature in a range from about 300° C. to about 800° C. After the annealing process, the unreacted metal material is removed.

In some embodiments, the source/drain silicide layers 240A, 240B and 240C are formed of one or more of cobalt silicide (e.g. CoSi, $CoSi_2$, $Co_2Si$, $Co_2Si$, $Co_3Si$; collectively "Co silicide"), titanium silicide (e.g. $Ti_5Si_3$, TiSi, $TiSi_2$, $TiSi_3$, $Ti_6Si_4$; collectively "Ti silicide"), nickel silicide (e.g. $Ni_3Si$, $Ni_{31}Si_{12}$, $Ni_2Si$, $Ni_3Si_2$, NiSi, $NiSi_2$; collectively "Ni silicide"), copper silicide (e.g. $Cu_{17}Si_3$, $Cu_{56}Si_{11}$, $Cu_5Si$, $Cu_{33}Si_7$, $Cu_4Si$, $Cu_{19}Si_6$, $Cu_3Si$, $Cu_{87}Si_{13}$; collectively "Cu silicide"), tungsten silicide ($W_5Si_3$, $WSi_2$; collectively "W silicide"), and molybdenum silicide ($Mo_3Si$, $Mo_5Si_3$, $MoSi_2$; collectively "Mo silicide").

Afterward, glue layers 242A, 242B and 242C are formed covering sidewall surfaces of the openings 232A, 232B and 232C. The glue layers 242A, 242B and 242C are formed covering the source/drain structures 220A and 220B and the gate structure 256C in the openings 232A, 232B and 232C (FIG. 2B), as shown in FIG. 2C in accordance with some embodiments. In addition, contact plugs 244A, 244B and 244C are formed filling the openings 232A, 232B and 232C. For example, the contact plugs 244A and 244B may be formed passing through the dielectric layers 222 and 226, and the contact plug 244C may be formed passing through the dielectric layer 226.

As shown in FIG. 2C, the glue layer 242A may be conformally formed over the source/drain silicide layer 240A and lines a sidewall surface 233A and a bottom of the opening 232A. The glue layer 242B may be conformally formed over the source/drain silicide layer 240B and lines a sidewall surface 233B and a bottom of the opening 232B. The glue layer 242C may be conformally formed over the gate structure 256C and lines the sidewall surface 233C and a bottom of the opening 232C. In addition, bottom surfaces 243A and 243B of the glue layers 242A and 242B are respectively in direct contact with the source/drain silicide layers 240A and 240B. Furthermore, the bottom surfaces 243A and 243B of the glue layers 242A and 242B may be respectively level with or lower than top surfaces of the source/drain silicide layers 240A and 240B.

As shown in FIG. 2C, the contact plugs 244A, 244B and 244C are surrounded by the glue layers 242A, 242B and 242C, respectively. The contact plugs 244A, 244B and 244C are surrounded by the dielectric layers 222 and 226. The contact plugs 244A and 244B are surrounded by the dielectric layers 222 and 226. The contact plug 244C is surrounded by the dielectric layer 226. In addition, the contact plug 244A is formed over the source/drain structure 220A. The contact plug 244B is formed over the source/drain structure 220B. The contact plug 244C is formed over the gate structure 256C. Furthermore, the contact plugs 244A and 244B may be electrically connected to the source/drain structures 220A and 220B through the glue layers 242A and 242B, respectively. The contact plug 244C may be electrically connected to the gate structure 256C through the glue layer 242C.

As shown in FIG. 2C, the contact plugs 244A and 244B may serve as source/drain contact plugs. In addition, the contact plug 244C may serve as a contact plug of the resulting 10 device 500C.

In some embodiments, the glue layers 242A, 242B and 242C and the contact plugs 244A, 244B and 244C are formed by deposition processes and a subsequent planarization process such as CMP. The glue layers 242A, 242B and 242C may include an electrically conductive material such as titanium (Ti), titanium nitride (TiN), tantalum (Ta), tantalum nitride (TaN), or the like, and may be formed by a CVD process, such as plasma-enhanced CVD (PECVD). However, other alternative processes, such as sputtering or metal organic chemical vapor deposition (MOCVD), physical vapor deposition (PVD), atomic layer deposition (ALD), may also be used. In some embodiments, the contact plugs 244A, 244B and 244C may be formed of cobalt (Co). In some other embodiments, the contact plugs 244A, 244B and 244C may be made of a conductive material, such as copper (Cu), aluminum (Al), tungsten (W), titanium (Ti), titanium nitride (TiN), tantalum (Ta), tantalum nitride (TaN), or another applicable material. The contact plugs 244A, 244B and 244C may be formed by any suitable deposition method, such as PVD, CVD, ALD, plating (e.g. electroplating).

Figure 2D:
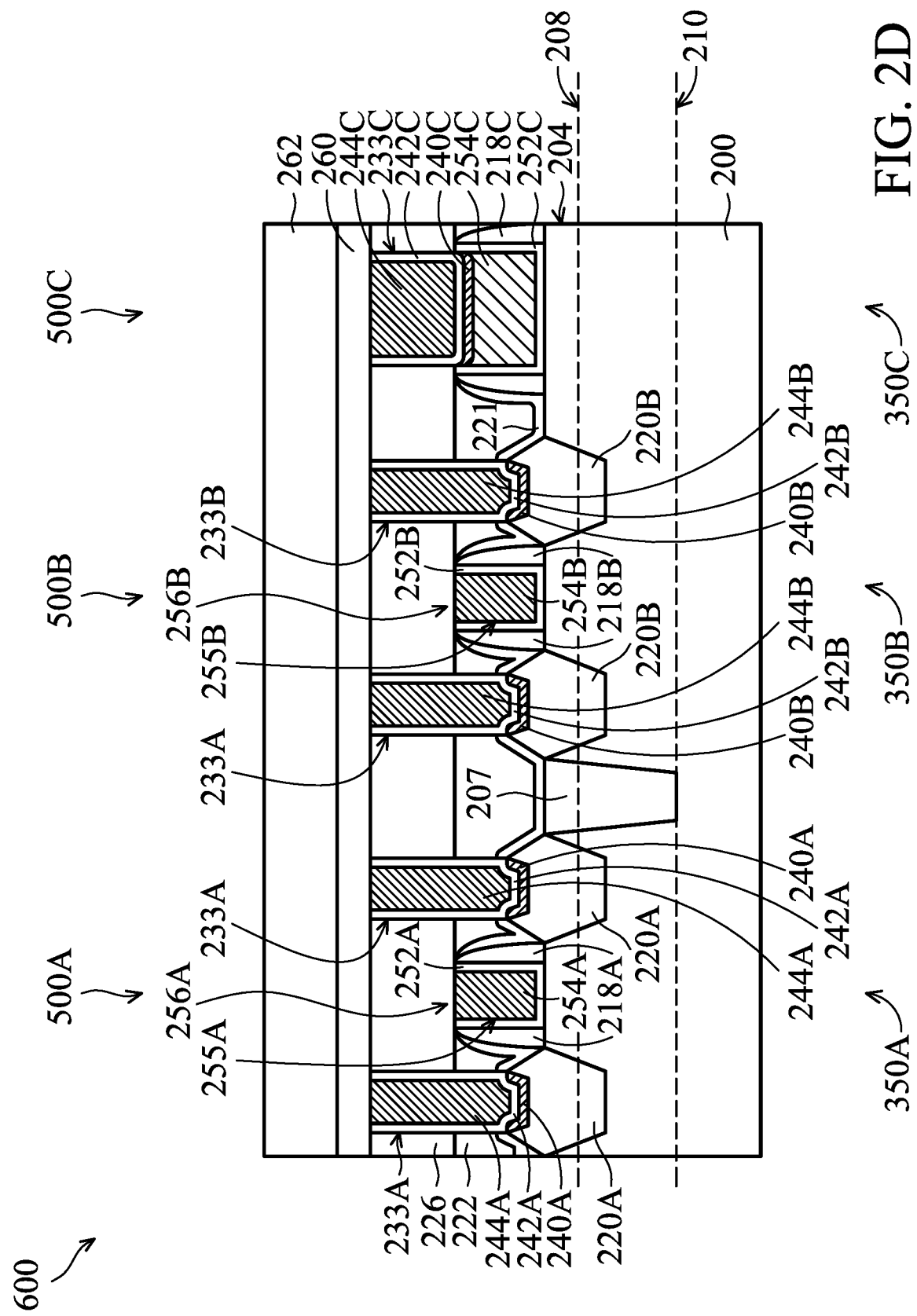

Afterwards, an etching stop layer (ESL) 260 is formed on the dielectric layer 226, as shown in FIG. 2D in accordance with some embodiments. The etching stop layer 260 may be formed overlying the glue layers 242A, 242B and 242C and the contact plugs 244A, 244B and 244C. The etching stop layer 260 may be a single layer or multiple layers. The etching stop layer 260 is made of silicon carbide (SiC), silicon nitride (SixNy), silicon carbonitride (SiCN), silicon oxycarbide (SiOC), silicon oxycarbon nitride (SiOCN), silicon oxide ($SiO_2$) or another applicable material. In some embodiments, the etching stop layer 260 has a bi-layer structure which includes a $SiO_2$ layer formed on a SiC layer. In addition, a SiC layer may be used as a glue layer to improve adhesion between the underlying layer and the $SiO_2$ layer. In some embodiments, the etching stop layer 260 is formed by performing a plasma enhanced chemical vapor deposition (CVD) process, a low pressure CVD process, an atomic layer deposition (ALD) process, or another applicable process.

Afterwards, a dielectric layer 262 (such as an inter-metal dielectric (IMD) layer) is formed over the contact plugs 244A, 244B and 244C, as shown in FIG. 2D in accordance with some embodiments. In addition, the dielectric layer 262 may be formed overlying the etching stop layer 260. The dielectric layer 262 may be a single layer or multiple layers. In some embodiments, the dielectric layer 262 is made of silicon oxide. In some other embodiments, the dielectric layer 262 is made of un-doped silicate glass (USG), fluorinated silicate glass (FSG), carbon-doped silicate glass, silicon nitride or silicon oxynitride.

In some embodiments, the dielectric layer 262 includes an extreme low-k (ELK) dielectric layer. ELK dielectric layer is made of ELK dielectric material which has a dielectric constant (k) less than about 2.5. ELK dielectric materials may include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials are made of a material including a porous version of an existing dielectric material, such as hydrogen silsesquioxane (HSQ), porous methyl silsesquioxane (MSQ), porous polyarylether (PAE), porous SiLK, or porous silicon dioxide ($SiO_2$). In some embodiments, ELK dielectric material is deposited by a plasma enhanced chemical vapor deposition (PECVD) process or by a spin coating process.

Figure 2E:
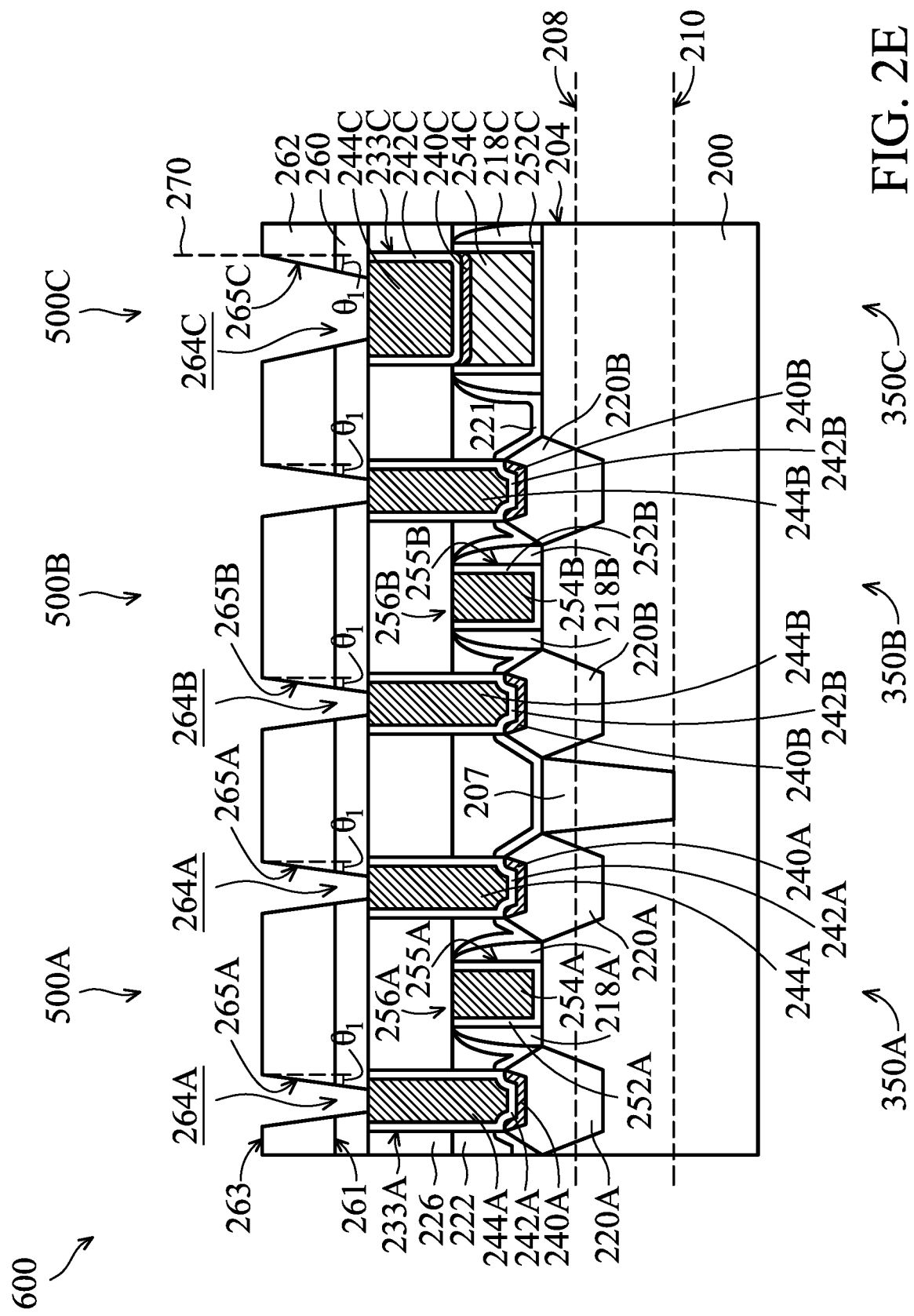

Afterwards, openings 264A, 264B and 264C are formed in the dielectric layer 262 to expose the contact plugs 244A, 244B and 244C by a patterning process, as shown in FIG. 2E in accordance with some embodiments. The patterning process is performed to remove portions of the dielectric layer 262 and the ESL 260 and to stop on the contact plugs 244A and 244B. Therefore, the openings 264A and 264B may be formed passing through the dielectric layer 262 and the ESL 260. In addition, the patterning process is performed to remove a portion of the dielectric layer 262 above the contact plug 244C. Therefore, the openings 264C may be formed through the dielectric layer 262 and expose the contact plug 244C.

In some embodiments, an angle θ1 between sidewall surfaces 265A, 265B and 265C of the openings 264A, 264B and 264C and a normal line 270 of a top surface 263 of the dielectric layer 226 is from about 15° to about 70°.

In some embodiments, the patterning process includes a photolithography process and a subsequent etching process. The photolithography process may include photoresist coating (e.g. spin-on coating), soft baking, mask aligning, exposure, post-exposure baking, developing the photoresist, rinsing and drying (e.g. hard baking). The etching process may include a dry etching process or a wet etching process. In some embodiments, the etching process is a dry etching process. In addition, etching gases used in the etching process include fluorine-containing (F-containing) gases. After the openings 264A, 264B and 264C are formed, the photoresist (not shown) may be removed by etching or any other suitable method.

Figure 2F:
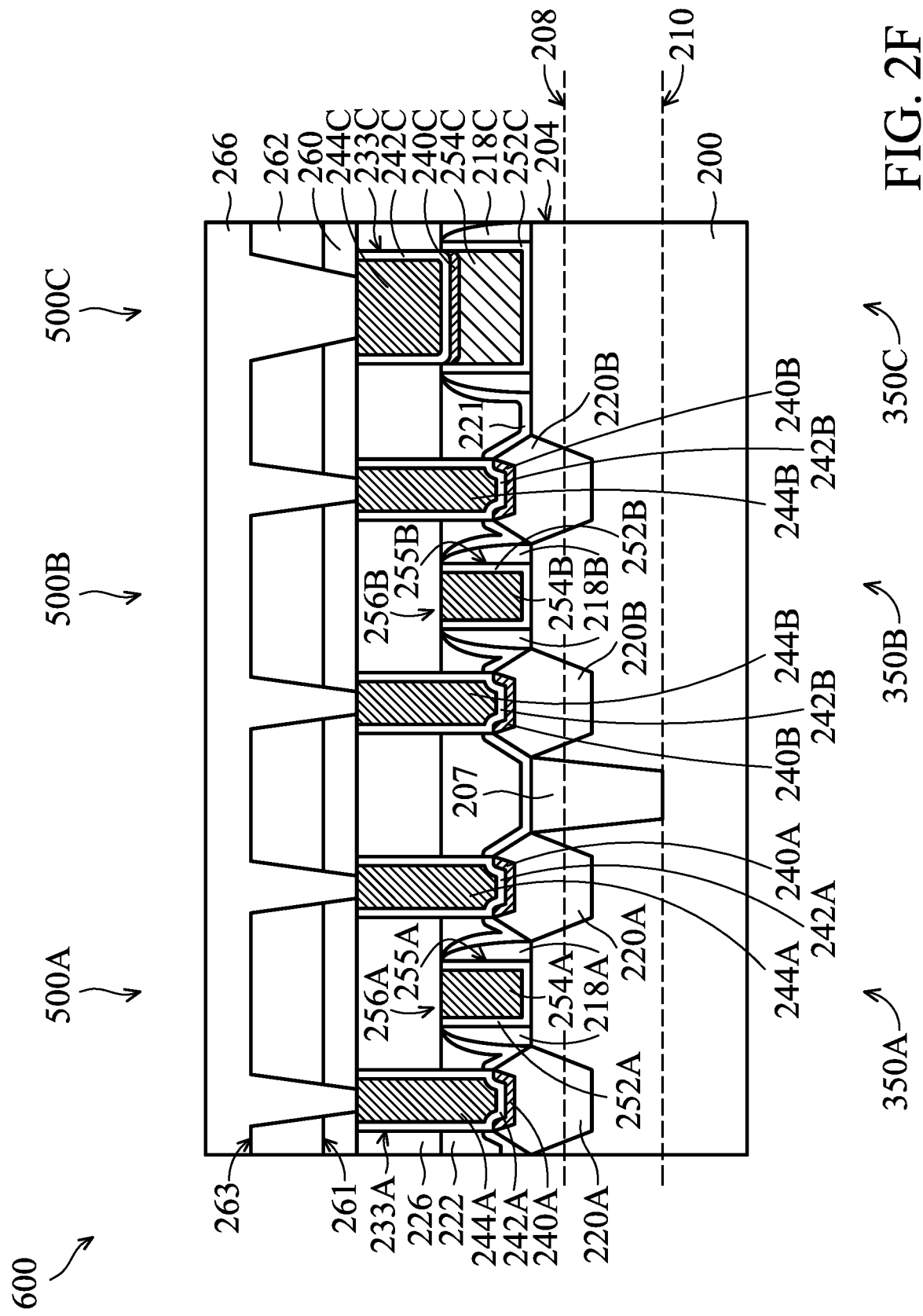

Afterwards, a metal material 266 is deposited over the dielectric layer 262 and filling the openings 264A, 264B and 264C, as shown in FIG. 2F in accordance with some embodiments. In addition, the metal material 266 is formed overlying a top surface 263 of the dielectric layer 262. In some embodiments, the metal material 266 is made of tungsten (W). In some other embodiments, the metal material 266 is made of cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another applicable material. In some embodiments, the metal material 266 is formed by any suitable deposition method, such as PVD, CVD, ALD, or plating (e.g. electroplating).

Figure 2G:
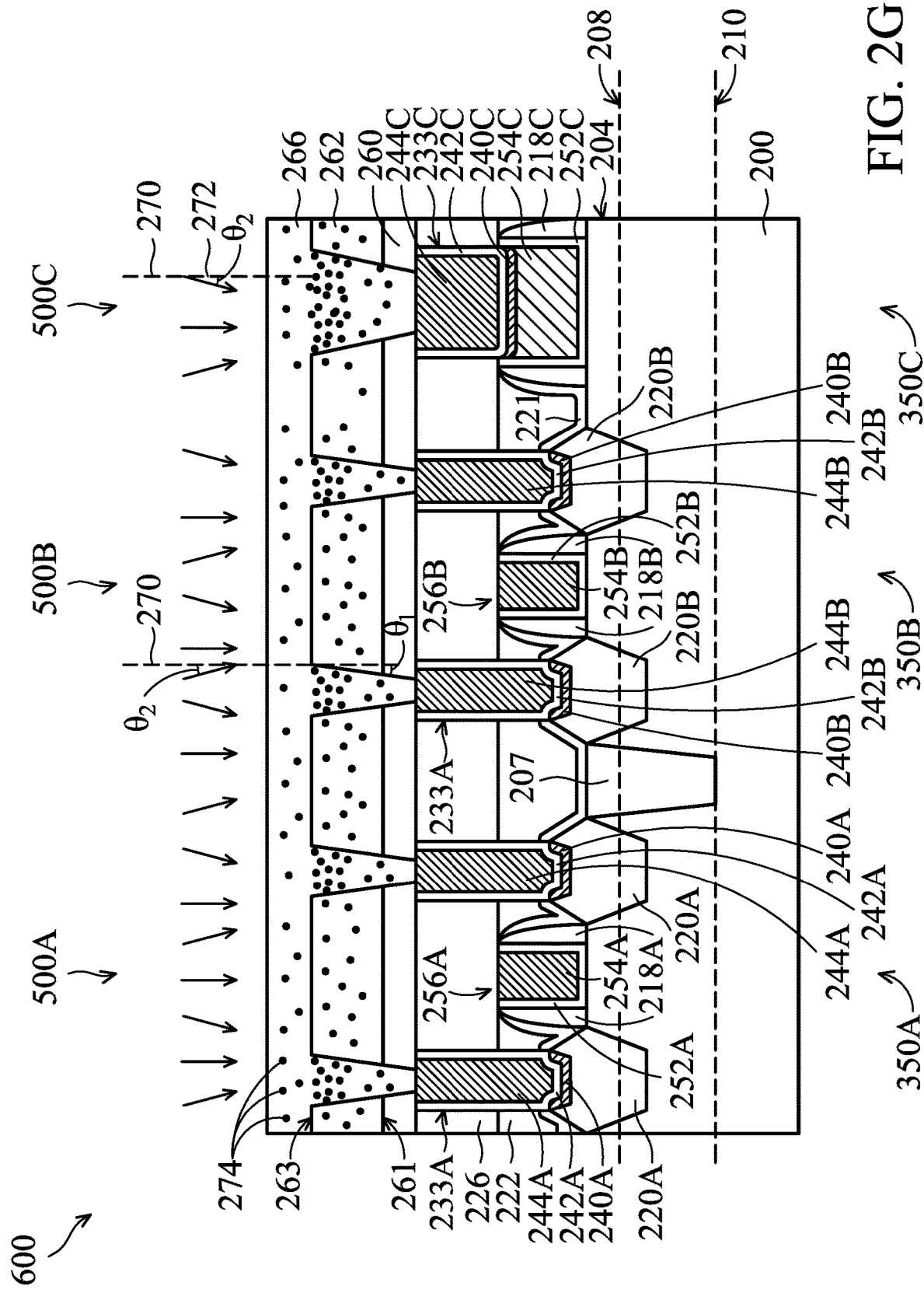

Afterwards, an implantation process 272 is performed to implant a first group IV element 274 into the metal material 266, as shown in FIG. 2G in accordance with some embodiments. Therefore, the metal material 266 may comprise the first group IV element 274 after performing the implantation process 272. The first group IV element 274 may fill spaces between metal ions in the metal material 266. In addition, the first group IV element 274 may react with the metal ions in the metal material 266 to form a first compound. In some embodiments, the first group IV element includes carbon (C), silicon (Si), germanium (Ge) or a combination thereof. For example, when the metal material 266 is tungsten (W), the first compound in the metal material 266 may include tungsten germanium (WGe), tungsten carbon (WC), tungsten silicon ($WSi_2$) or a combination thereof. The first compound may increase the mechanical strength of the metal material 266.

In some embodiments, the first group IV element 274 is implanted into the dielectric layer 262 including (formed of) a second compound, such as silicon dioxide ($SiO_2$), after performing the implantation process 272. Therefore, the dielectric layer 262 may include the first group IV element 274 and the second group IV element after performing the implantation process 272. The first group IV element 274 may be the same as or different to the second group IV element. For example, when the first group IV element 274 includes carbon (C), silicon (Si) or germanium (Ge) includes carbon (C), silicon (Si) or germanium (Ge), the second group IV element may include silicon (Si). In addition, the second group IV element, such as silicon (Si), is uniform in the dielectric layer 262. Furthermore, the first group IV element 274 may react with the dielectric layer 262 to form a third compound. In some embodiments, the third compound may be the same as or different to the second compound. For example, the lattice constant of the third compound may be greater than or equal to the lattice constant of the second compound in the dielectric layer 262. For example, when the second compound is silicon dioxide (SiO$_2$), the third compound may include carbon dioxide (CO$_2$), germanium dioxide (GeO$_2$) or a combination thereof. In addition, the dielectric layer 262 may be formed of carbon dioxide (CO$_2$), silicon dioxide (SiO$_2$), germanium dioxide (GeO$_2$) or a combination thereof after performing the implantation process 272.

In some embodiments, the maximum concentration of the first group IV element 274 in the metal material 266 is located at a close position to the top surface 263 of the dielectric layer 262 after implanting the first group IV element 274 into the metal material 266 (i.e. after performing the implantation process 272). In some embodiments, the maximum concentration of the first group IV element 274 in the metal material 266 may be located between the top surface 263 and a bottom surface 261 of the dielectric layer 262.

In some embodiments, the maximum concentration of the first group IV element 274 in the dielectric layer 262 is located at a position close to the top surface 263 of the dielectric layer 262 after performing the implantation process 272.

In some embodiments, the implantation process 272 is performed with an implantation energy in a range from about 25 KeV to about 40 KeV. For example, when thickness of the dielectric layer 262 is about 350 Å, the implantation energy of the implantation process 272 may be about 30 KeV. In some embodiments, the implantation process 272 is performed with an incident implant angle $\theta 2$ that is the equal to the angle $\theta 1$. For example, the first group IV element 274 may be implanted into the metal material by an implantation process 272 with an incident implant angle $\theta 2$ in a range from about 15° to about 70°.

In some embodiments, the implantation process 272 is performed in several times by rotating the substrate 200. Therefore, different portions of the metal material 266 and/or the dielectric layer 262 may be separately implanted with the first group IV element 274. For example, the implantation process 272 is performed by repositioning the substrate 200 four times by rotating it 90 degrees. Four different portions of the metal material 266 (or the dielectric layer 262) may be implanted with the first group IV element 274. The first group IV element 274 may be distributed uniformly in the metal material 266 and/or the dielectric layer 262 by rotating the substrate 200 during the implantation process 272.

In some embodiments, the first compound (e.g. WGe, WC or WSi$_2$) in the metal material 266 may help to densify the structure of the metal material 266. Therefore, the mechanical strength of the metal material 266 with first group IV element 274 may be improved. In some embodiments, the second compound (e.g. GeO$_2$) in the dielectric layer 262 may help to increase the lattice constant of the dielectric layer 262. The density of the dielectric layer 262 may be reduced after performing the implantation process 272. Therefore, compressive stress may occur between the metal material 266 and the dielectric layer 262 after performing the implantation process 272. In some embodiments, the maximum compressive stress may occur at an interface between the metal material 266 and the dielectric layer 262 having the maximum concentration of the first group IV element 274.

Figure 2H:
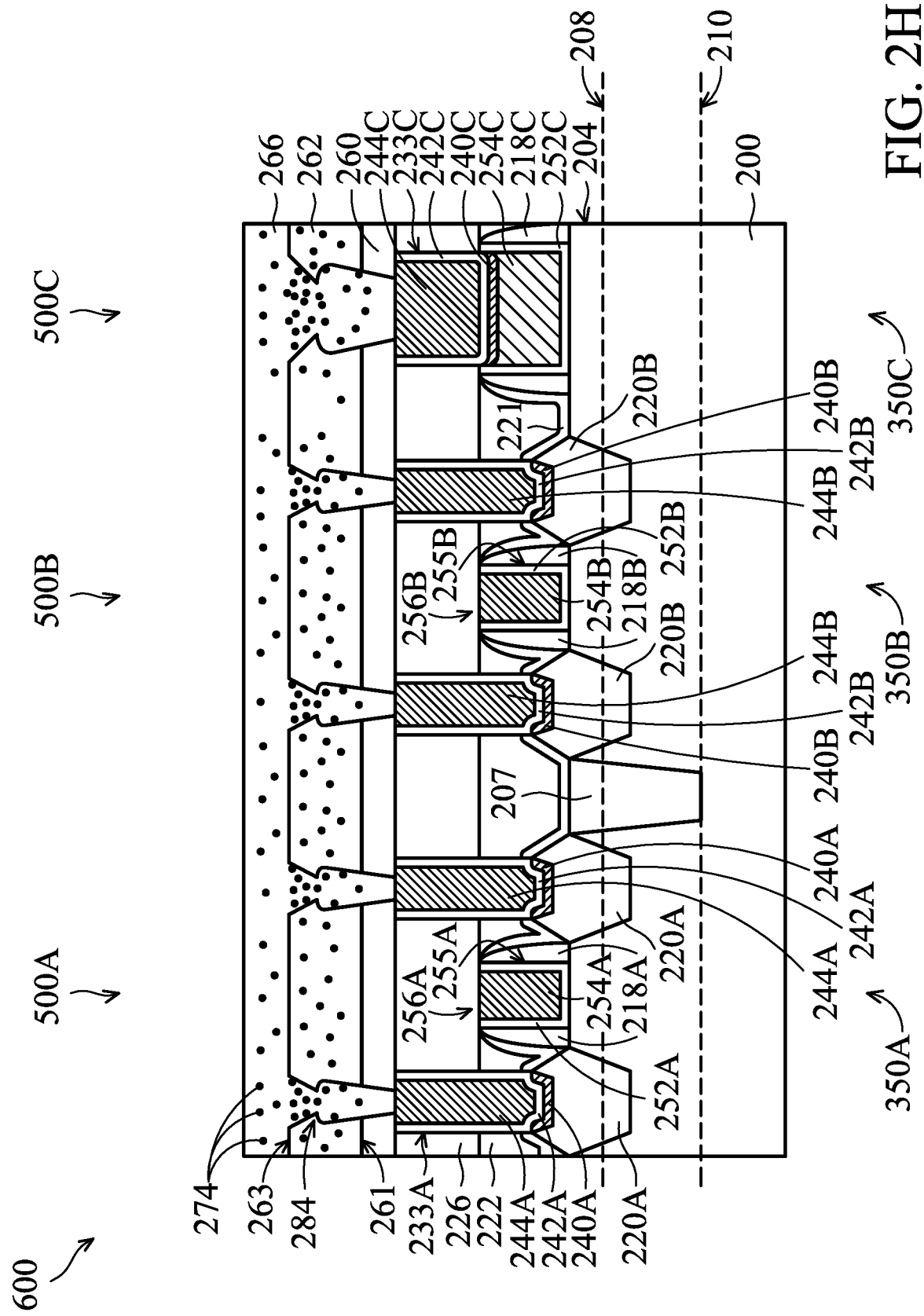

After the first group IV element 274 is implanted into the metal material 266 (i.e. after performing the implantation process 272), the metal material 266 in each of the openings 264A, 264B and 264C is changed from being tapered to having an hourglass shape in the cross-sectional view shown in FIG. 2H. In some embodiments, the metal material 266 in each of the openings 264A, 264B and 264C has a narrow neck portion 284 at a position having the maximum concentration of the first group IV element 274.

In some embodiments, the difference between the mechanical strength of the metal material 266 and the mechanical strength of the dielectric layer 262 may be reduced. The mechanical strengths of metal material 266 and the dielectric layer 262 may be uniform after performing the implantation process 272.

Figure 2I:
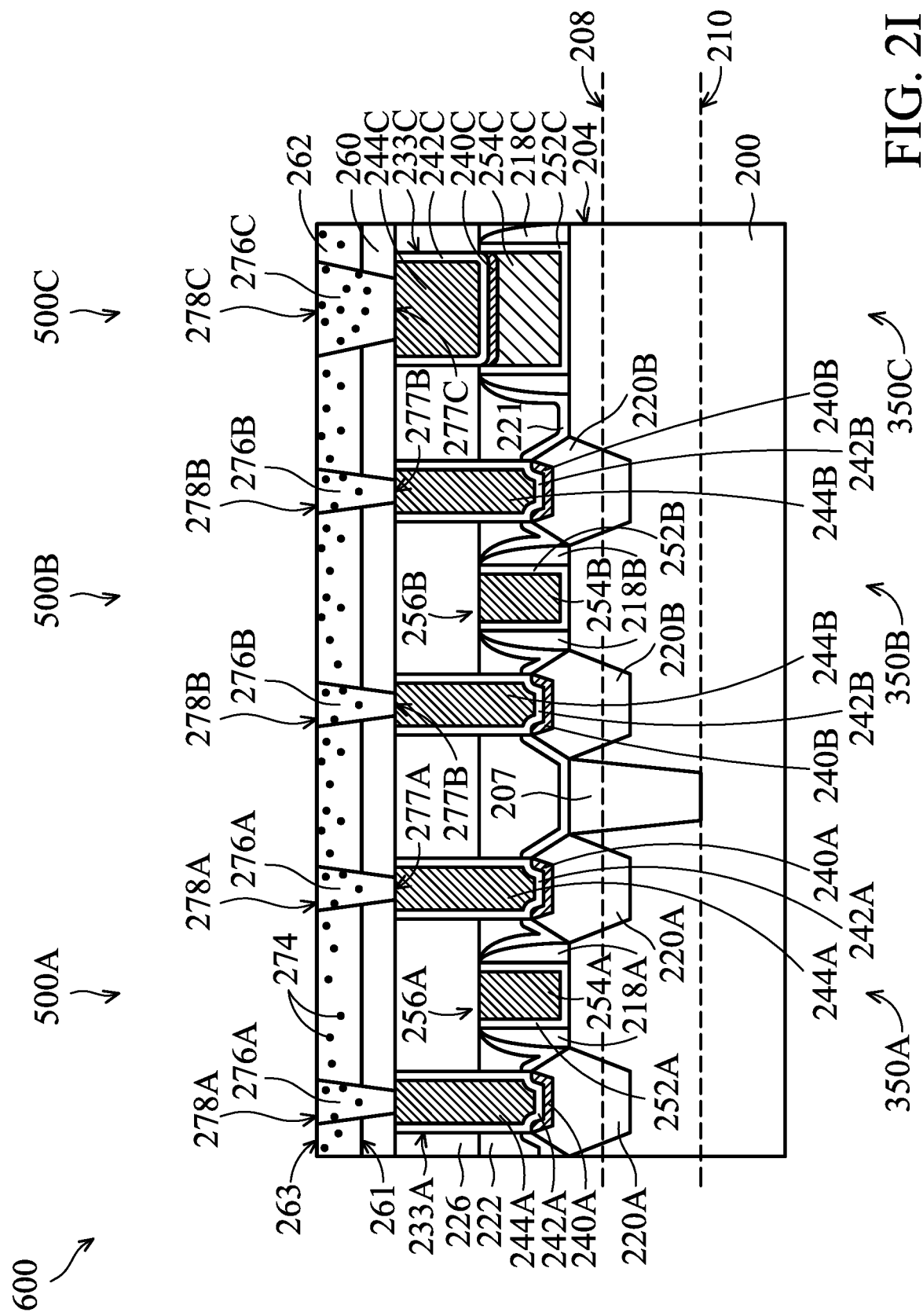

Afterwards, a portion of the metal material 266 above the top surface 263 of the dielectric layer 262 is removed to form via plugs 276A, 276B and 276C, as shown in FIG. 2I in accordance with some embodiments. The via plugs 276A, 276B and 276C may be formed over the contact plugs 244A, 244B and 244C, respectively.

A planarization process, such as chemical mechanical polish (CMP), may be performed to level the top surface of the metal material 266 with the top surface 263 of the dielectric layer 262. Therefore, the via plugs 276A, 276B and 276C are formed passing through the dielectric layer 262 and the etching stop layer 260. The via plugs 276A, 276B and 276C are surrounded by the dielectric layer 262. The top surface 263 of the dielectric layer 262 may be aligned with top surfaces 278A, 278B and 278C of the via plugs 276A, 276B and 276C. In addition, the bottom surface 261 of the dielectric layer 262 may be positioned between the top surfaces 278A, 278B and 278C and bottom surfaces 277A, 277B and 277C of the via plugs 276A, 276B and 276C. Moreover, the bottom surfaces 277A, 277B and 277C of the via plugs 276A, 276B and 276C are in contact with contact plugs 244A, 244B and 244C, respectively.

In some embodiments, the planarization process may remove a portion of the dielectric layer 262 from the top surface 263 of the dielectric layer 262. For example, the planarization process may remove a portion of the dielectric layer 262 and a portion of the metal material 266 above or slightly below the narrow neck portion 284 of the metal material 266 in each of the openings 264A, 264B and 264C shown in FIG. 2H.

In some embodiments, the concentration of the first group IV element 274 in the via plugs 276A, 276B and 276C gradually decreases from the top surfaces 278A, 278B and 278C to the bottom surfaces 277A, 277B and 277C of the via plugs 276A, 276B and 276C. In addition, the concentration of the first group IV element 274 in the dielectric layer 262 may be gradually decreased from the top surface 263 to the bottom surface 261 of the dielectric layer 262. Furthermore, the concentration of the second group IV element (i.e. silicon) is uniform in the dielectric layer 262.

Because the compressive stress between the via plugs 276A, 276B and 276C and the dielectric layer 262 may be induced by performing the implantation process 272. The via plugs 276A, 276B and 276C and the dielectric layer 262 have uniform mechanical strengths. The crack between the via plugs 276A, 276B and 276C and the dielectric layer 262 may be sealed or eliminated. Therefore, the CMP slurry used in the planarization process (e.g. CMP process) may not attack the via plugs 276A, 276B and 276C and result in the loss of the contact plugs 244A, 244B and 244C.

After performing the aforementioned processes, the FinFET 500A is formed in the first region 350A, the FinFET 500B is formed in the second region 350B and an input/output (I/O) device 500C is formed in the third region 350C. Moreover, a semiconductor structure 600 including the FinFET 500A (e.g. the N-type FinFET), the FinFET 500B e.g. the P-type FinFET) and the I/O device 500C is formed, as shown in FIG. 2I in accordance with some embodiments.

In some embodiments, the semiconductor structure 600 includes the via plugs 276A, 276B and 276C implanted with the first group IV element 274. The first group IV element 274 may fill spaces between the metal ions in the via plugs 276A, 276B and 276C. The first group IV element 274 may react with the metal ions in the via plugs 276A, 276B and 276C to form the first compound including tungsten germanium (WGe), tungsten carbon (WC), tungsten silicon (WSi2). In some embodiments, each of the via plugs 276A, 276B and 276C may include tungsten (W) and the first compound (e.g., tungsten germanium (WGe), tungsten carbon (WC), tungsten silicon (WSi2), or a combination thereof). In some embodiments, the first group IV element 274 may be implanted in the dielectric layer 262 including the second group IV element (e.g. silicon) (or including a second compound, such as silicon dioxide (SiO2)). The first group IV element 274 may react with the dielectric layer 262 to form the third compound including carbon dioxide (CO2), silicon dioxide (SiO2), germanium dioxide (GeO2). The lattice constant of the dielectric layer 262 may be increased. Furthermore, the implanted first group IV element 274 may induce the compressive stress between the via plugs 276A, 276B and 276C and the dielectric layer 262. Therefore, the mechanical strength of the via plugs 276A, 276B and 276C may be improved. In addition, the mechanical strengths of the via plugs 276A, 276B and 276C and the dielectric layer 262 may become uniform. The crack occurring at the interface between the via plugs 276A, 276B and 276C and the dielectric layer 262 may be sealed or eliminated. The via plugs 276A, 276B and 276C implanted with the first group IV element 274 may prevent the CMP slurry from attacking the via plugs 276A, 276B and 276C. Therefore, the contact plug loss problem of the contact plugs may be eliminated during the planarization process (e.g. the W CMP process) of the via plugs 276A, 276B and 276C. The problem of increasing contact plug resistance may be improved.

As described previously, the semiconductor structure (e.g. the semiconductor structures 600) includes the via plugs (e.g. the first via plugs 276A, 276B and 276C including the first group IV element (e.g. the first group IV element 274). The first group IV element may react with the via plugs to form the first compound including WGe, WC or WSi$_2$. In addition, the dielectric layer (e.g. the dielectric layer 262) surrounding the via plugs may include the first group IV element and second group IV element (e.g. silicon). The first group IV element may react with the dielectric layer to form the third compound including CO$_2$, SiO$_2$ or GeO$_2$. Therefore, the structure of the via plugs may be densified. The via plugs and the dielectric layer may have uniform mechanical strengths. The contact plug loss problem of the contact plugs may be eliminated during the planarization process of the via plugs. The problem of increasing contact plug resistance may be improved.

Embodiments of a semiconductor structure and a method for forming the same are provided. The semiconductor structure includes a gate structure, a source/drain structure, a first contact plug and a first via plug. The first via plug is positioned over the first contact plug and includes a first group IV element. The first group IV element may fill spaces in the via plugs and react with the via plugs to form the first compound to densify the structure of the via plugs. Therefore, the contact plug loss problem of the contact plugs may be eliminated during the planarization process (e.g. the W CMP process) of the via plugs.

In some embodiments, a semiconductor structure is provided. The semiconductor structure includes a gate structure, a source/drain structure, a first contact plug and a first via plug. The gate structure is positioned over a fin structure. The source/drain structure is positioned in the fin structure and adjacent to the gate structure. The first contact plug is positioned over the source/drain structure. The first via plug is positioned over the first contact plug. The first via plug includes a first group IV element.

In some embodiments, a semiconductor structure is provided. The semiconductor structure includes a gate structure, a source/drain structure, a dielectric layer and a via plug. The gate structure is positioned over a fin structure. The source/drain structure is positioned in the fin structure and adjacent to the gate structure. The dielectric layer is positioned over the gate structure and the source/drain structure. The via plug is positioned passing through the dielectric layer. The via plug includes a first group IV element. The dielectric layer includes a second group IV element.

In some embodiments, a method for forming a semiconductor structure is provided. The method includes forming a gate structure over a fin structure. The method further includes forming a source/drain structure in the fin structure and adjacent to the gate structure. The method further includes forming a contact plug over the source/drain structure. The method further includes forming a first dielectric layer over the contact plug. The method further includes forming a first opening in the first dielectric layer to expose the contact plug. The method further includes depositing a metal material filling the first opening. The method further includes implanting a first group IV element into the metal material. The method further includes removing a portion of the metal material above a top surface of the first dielectric layer to form a via plug over the contact plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a gate structure over a fin structure;
   forming a source/drain structure in the fin structure and adjacent to the gate structure;
   forming a contact plug over the source/drain structure;
   forming a dielectric layer over the contact plug;
   forming an opening in the dielectric layer to expose the contact plug;
   depositing a metal material to fill the opening and cover a top surface of the dielectric layer;
   implanting a first group IV element into the metal material and the dielectric layer covered by the metal material; and
   removing a portion of the metal material above the top surface of the dielectric layer to form a via plug over the contact plug.

2. The method for forming a semiconductor structure as claimed in claim 1, wherein the maximum concentration of the first group IV element in the metal material is located at a position between the top surface and bottom surface of the dielectric layer after implanting the first group IV element into the metal material.

3. The method for forming a semiconductor structure as claimed in claim 1, wherein the first group IV element and the metal material form a first compound after implanting the first group IV element into the metal material.

4. The method for forming a semiconductor structure as claimed in claim 1, further comprising:
  implanting the first group IV element into the dielectric layer comprising a second compound to form a third compound in the dielectric layer.

5. The method for forming a semiconductor structure as claimed in claim 4, wherein the lattice constant of the third compound is greater than the lattice constant of the second compound in the dielectric layer.

6. The method for forming a semiconductor structure as claimed in claim 4, wherein the metal material in the opening is hourglass-shaped after implanting the first group IV element into the metal material.

7. The method for forming a semiconductor structure as claimed in claim 6, wherein the metal material in the first opening has a narrow neck portion at a position having the maximum concentration of the first group IV element.

8. A method for forming a semiconductor structure, comprising:
  patterning a substrate to form a fin structure;
  forming a gate structure on the fin structure;
  forming a source/drain structure on the fin structure, wherein the source/drain structure is adjacent to the gate structure;
  forming a contact plug on the source/drain structure;
  forming a dielectric layer on the contact plug;
  forming an opening in the dielectric layer to expose the contact plug;
  filling the opening with a metal material;
  performing an implantation process to induce a compressive stress between the metal material and the dielectric layer caused by an element implanted in the metal material and the dielectric layer, wherein the metal material covers a top surface of the dielectric layer; and
  after performing the implantation process, performing a planarization process on the metal material until a top surface of the dielectric layer is exposed.

9. The method for forming a semiconductor structure as claimed in claim 8, wherein the performing the implantation process comprises implanting a first group IV element into the metal material and the dielectric layer.

10. The method for forming a semiconductor structure as claimed in claim 9, wherein the metal material reacts with the first group IV element to form a first compound, the dielectric layer comprises a second compound, and the dielectric layer reacts with the first group IV element to form a third compound.

11. The method for forming a semiconductor structure as claimed in claim 10, wherein a lattice constant of the third compound is greater than a lattice constant of the second compound.

12. The method for forming a semiconductor structure as claimed in claim 8, wherein the implantation process is performed with an implantation energy in a range from about 25 KeV to about 40 KeV.

13. The method for forming a semiconductor structure as claimed in claim 8, further comprising:
  implanting a first group IV element into the metal material and the dielectric layer covered by the metal material; and
  removing a portion of the metal material above the top surface of the dielectric layer to form a via plug over the contact plug.

14. A method for forming a semiconductor structure, comprising:
  forming a gate structure over a fin structure;
  forming a source/drain structure in the fin structure, wherein the source/drain structure is adjacent to the gate structure;
  forming a contact plug on the source/drain structure;
  forming a dielectric layer on the contact plug;
  forming an opening in the dielectric layer to expose the contact plug;
  depositing a metal material to fill the opening;
  performing an implantation process to implant a first group IV element into the metal material and the dielectric layer, wherein a difference between the mechanical strength of the metal material and the mechanical strength of the dielectric layer is reduced after the implantation process; and
  depositing the metal material directly above the dielectric layer,
  wherein the performing the implantation process comprises implanting the first group IV element into the metal material and the dielectric layer that is directly below the metal material.

15. The method for forming a semiconductor structure as claimed in claim 14, wherein the metal material is densified after the implantation process.

16. The method for forming a semiconductor structure as claimed in claim 14, wherein a mechanical strength of the metal material is increased after the implantation process.

17. The method for forming a semiconductor structure as claimed in claim 14, wherein a density of the dielectric layer is reduced after the implantation process.

18. The method for forming a semiconductor structure as claimed in claim 14, wherein the metal material in the opening has an hourglass shape after the implantation process.

19. The method for forming a semiconductor structure as claimed in claim 14, wherein the dielectric layer comprises a first compound comprising a second group IV element, and the first compound of the dielectric layer reacts with the first group IV element to form a second compound different from the first compound.

20. The method for forming a semiconductor structure as claimed in claim 19, wherein a lattice constant of the second compound is greater than a lattice constant of the first compound.

* * * * *